(12) United States Patent
Chatterjee et al.

(10) Patent No.: US 10,748,818 B2
(45) Date of Patent: Aug. 18, 2020

(54) DYNAMIC BIASING TO MITIGATE ELECTRICAL STRESS IN INTEGRATED RESISTORS

(71) Applicant: Texas Instruments Incorporated, Dallas, TX (US)

(72) Inventors: Tathagata Chatterjee, Allen, TX (US); Steven Loveless, Sachse, TX (US); James Robert Todd, Plano, TX (US); Andrew Strachan, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/231,243

(22) Filed: Dec. 21, 2018

(65) Prior Publication Data

US 2020/0203230 A1 Jun. 25, 2020

(51) Int. Cl.
*H01L 49/02* (2006.01)
*H01L 21/8234* (2006.01)
*H01L 21/762* (2006.01)
*H01L 23/528* (2006.01)
*H01L 23/00* (2006.01)
*H01L 23/532* (2006.01)

(52) U.S. Cl.
CPC ........... *H01L 21/823481* (2013.01); *H01L 21/76224* (2013.01); *H01L 23/528* (2013.01); *H01L 23/53295* (2013.01); *H01L 24/02* (2013.01); *H01L 28/20* (2013.01); *H01L 2924/1306* (2013.01); *H01L 2924/14* (2013.01)

(58) Field of Classification Search
CPC ....... H01L 21/823481; H01L 21/76224; H01L 23/528; H01L 23/53295; H01L 24/02; H01L 2924/1306; H01L 2924/14; H01L 28/20
See application file for complete search history.

(56) References Cited

U.S. PATENT DOCUMENTS

| | | | |
|---|---|---|---|
| 9,548,298 B1 * | 1/2017 | Tian | H01L 27/0623 |
| 10,404,059 B2 * | 9/2019 | Salcedo | H01L 27/0262 |
| 2012/0199874 A1 * | 8/2012 | Salcedo | H01L 29/66386 257/120 |

* cited by examiner

*Primary Examiner* — Timor Karimy
(74) *Attorney, Agent, or Firm* — Andrew R. Ralston; Charles A. Brill; Frank D. Cimino

(57) ABSTRACT

In various examples, a method and apparatus are provided to achieve dynamic biasing to mitigate electrical stress. Described examples include a device includes a first resistor portion having a first terminal and a second terminal, and a second resistor portion having a third terminal and a fourth terminal. The device also includes a well in a substrate proximate to the first resistor portion and the second resistor portion and an insulating layer between the well and the first resistor portion and the second resistor portion. The device also includes a transistor having a control terminal coupled to the second terminal of the first resistor portion and the third terminal of the second resistor portion, the transistor having a first current-handling terminal coupled to a first voltage and a second current-handling terminal coupled to a current source and to the well.

8 Claims, 7 Drawing Sheets

DYNAMIC BIASING TO MITIGATE ELECTRICAL STRESS IN INTEGRATED RESISTORS

TECHNICAL FIELD

This relates generally to semiconductor devices, and, in particular, examples to reducing electrical stress in semiconductor devices.

BACKGROUND

Semiconductor devices, such as transistors and polysilicon-based resistors, use various insulating materials to conductively isolate portions of these devices. For example, polysilicon resistors are often formed on insulating layers to prevent conduction and mitigate other electrical activity with components on the other side of the insulating layers. An example is polysilicon resistors formed in shallow trench isolation (STI) devices. In STI, an epitaxial layer is formed on a substrate. The epitaxial layer is selectively etched to form shallow trenches that are subsequently filled with an insulator, such as silicon dioxide, that may be deposited using chemical vapor deposition techniques. Under ideal conditions, these silicon dioxide layers provide very good insulation. However, conditions are sometimes not ideal. When etching the shallow trench, particles from various sources can settle in unwanted places. Despite sophisticated cleaning procedures, these particles may not be completely removed. During the shallow trench etching process, these particles may block the etchant and leave a cone of epitaxial material. This creates a thin spot in the subsequently deposited insulator. In addition, these thin spots typically cannot be detected using test screens for functionality because the device performs as designed until a large electric field occurs at the thin spot, breaking through the insulation. Thus, the device may pass testing, but fail in use. Thus, there is a need for a device design that reduces the risk of failure of the insulator between the cone and an overlying circuit.

DETAILED DESCRIPTION

Figure 1:
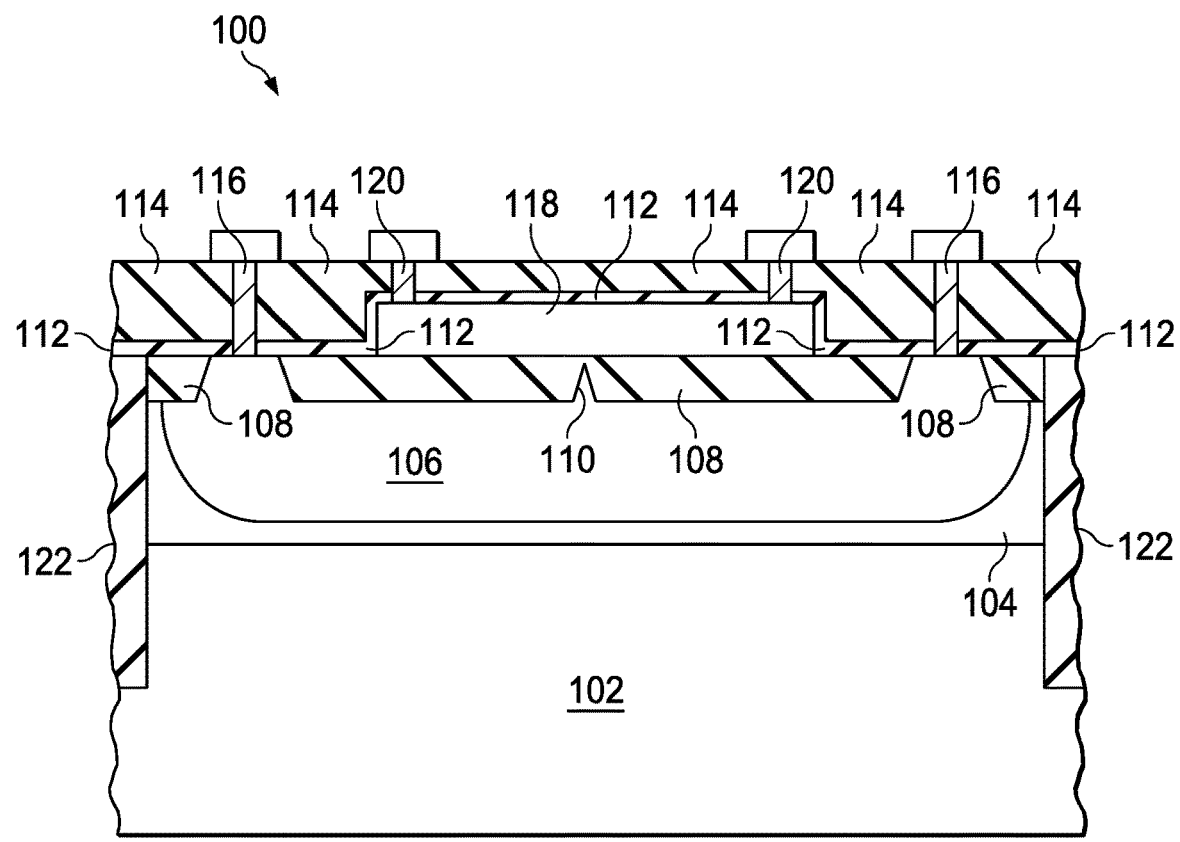
FIG. 1 is a sectional diagram of an example semiconductor device including a cone defect.

In various examples, a method and apparatus are provided that may achieve dynamic biasing to mitigate electrical stress. In described examples, the biasing in a well proximate to a pair of resistor elements dynamically adjusts based on the potential at a connection between the resistor elements to reduce the stress between the resistor elements and the well. While such examples may be expected to provide improvements in various device operating parameters, e.g. increased device lifetime, no particular result is a requirement unless explicitly recited in a particular claim. In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." The term "directly coupled" may include conductive connections between terminals of two devices with no intervening components, e.g. only metal lines and/or vias connected between the terminals. Also, in this description, the terms "on" and "over" may include layers or other elements where intervening or additional elements are between an element and the element that it is "on" or "over." However, the term "directly on", when used to describe the relationship of a first feature to a second features, means the first feature makes direct physical contact to the second feature without any intervening different material layer(s).

In accordance with an example, a device includes a first resistor portion having a first terminal and a second terminal, and a second resistor portion having a third terminal and a fourth terminal. The device also includes a well layer in a substrate proximate to the first resistor portion and the second resistor portion and an insulating layer between the well layer and the first resistor portion and the second resistor portion. The device also includes a transistor having a control terminal coupled to the second terminal of the first resistor portion and the third terminal of the second resistor portion, the transistor having a first current-handling terminal coupled to a first voltage and a second current-handling terminal coupled to a current source, such as a fixed current source a resistor, a breakdown diode or a leakage path, and to the well layer.

FIG. 1 is an example semiconductor device including a cone defect. Polycrystalline resistor 100 is located over a shallow trench isolation (STI) structure. Epitaxial layer 104 is on substrate 102. In this example, epitaxial layer 104 and substrate 102 are crystalline silicon. Ion implantation, for example, forms within epitaxial layer 104 a well 106, sometimes referred to as shallow well 106. The doping type of shallow well 106 is opposite the doping type of epitaxial layer 104. In one example, shallow well 106 is doped N type and epitaxial layer 104 is lightly doped P type. As explained further hereinbelow, chemical vapor deposition, for example, fills a shallow trench on the surface of shallow well 106 with an insulator, such as silicon dioxide. Silicon dioxide is an excellent insulator and can withstand high voltages. For example, with an STI layer 108 of several hundred nanometers such as 400 nm, STI layer 108 can withstand voltages greater than 50 V. However, as explained further hereinbelow, stray particles in the STI area can block the etchant and create cones, such as cone 110. This creates a thin spot at the top of cone 110 where the insulating power of STI layer 108 is significantly compromised. Using design rules that limit the voltage stress on the STI layer 108 to less than 10 V can allow for designs with acceptable failure rates. However, it is desirable to be able to use designs with higher voltage limits. It is noted that the value 10 V is presented only as an example, and that other voltage limit values may be used based on, e.g. the type or source of dielectric used in the STI layer 108, or different target failure rates. Thus, the voltage limit provided to reduce dielectric punch-through at the cone 110 may be referred to as a "predetermined reliability limit voltage".

A resistive element 118 is formed on the surface of STI layer 108. In this example, resistive element 118 is a doped polycrystalline silicon layer. Insulating layer 112 and insulating layer 114 are formed on resistive element 118 and the exposed surfaces of STI layer 108 and shallow well 106. Contacts 116 are formed to provide electrical connection to shallow well 106 and contacts 120 are formed to provide electrical connection to opposite ends of resistive element 118. In an example, deep trench isolation 122 surrounds well 106. Deep trench isolation 122 includes deep trenches extending through epitaxial layer 104 that may be filled with an insulating material such as silicon dioxide.

Figure 2:
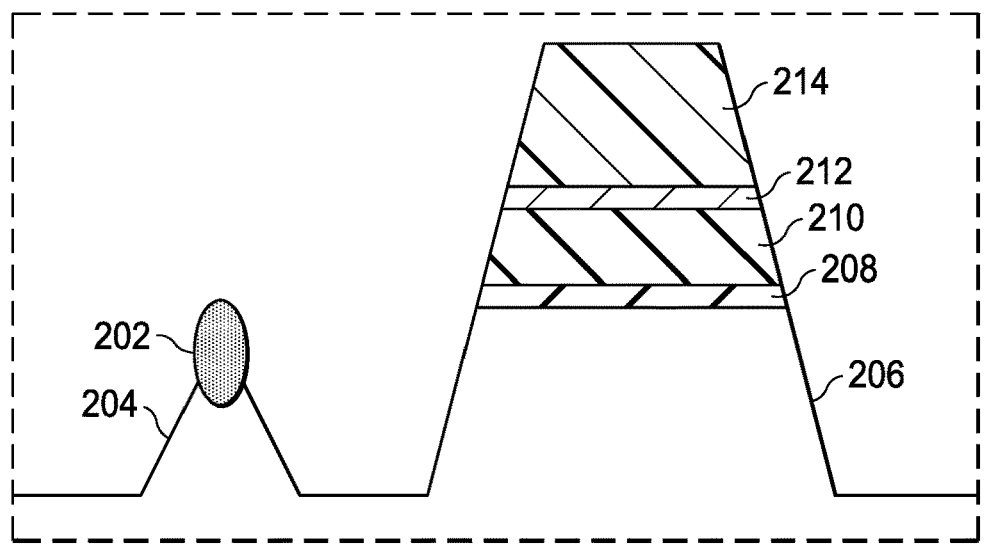
FIG. 2 is a detail diagram showing an example of contamination leading to cones in STI layers.

FIG. 2 is a detail diagram explaining the source of the contamination leading to cones in STI layers. Cone 204 is formed during etching of the shallow well due to the presence of particle 202. To the right of FIG. 2 is a pillar 206 that is desired for a contact to the shallow well. To form this pillar, a mask including a pad oxide 208, silicon nitride layer 210, a bottom anti-reflective layer (BARC) or silicon oxynitride layer 212 and resist layer 214. The BARC layer 212 allows for sharper development of resist layer 214 in the desired pattern. When patterning resist layer 214, BARC layer 212 and silicon nitride layer 210, particles, such as particle 202, may deposit on the surface of the shallow well. Sophisticated cleaning processes minimize the chance of residual particles, but no cleaning process is perfect.

Figure 3A:
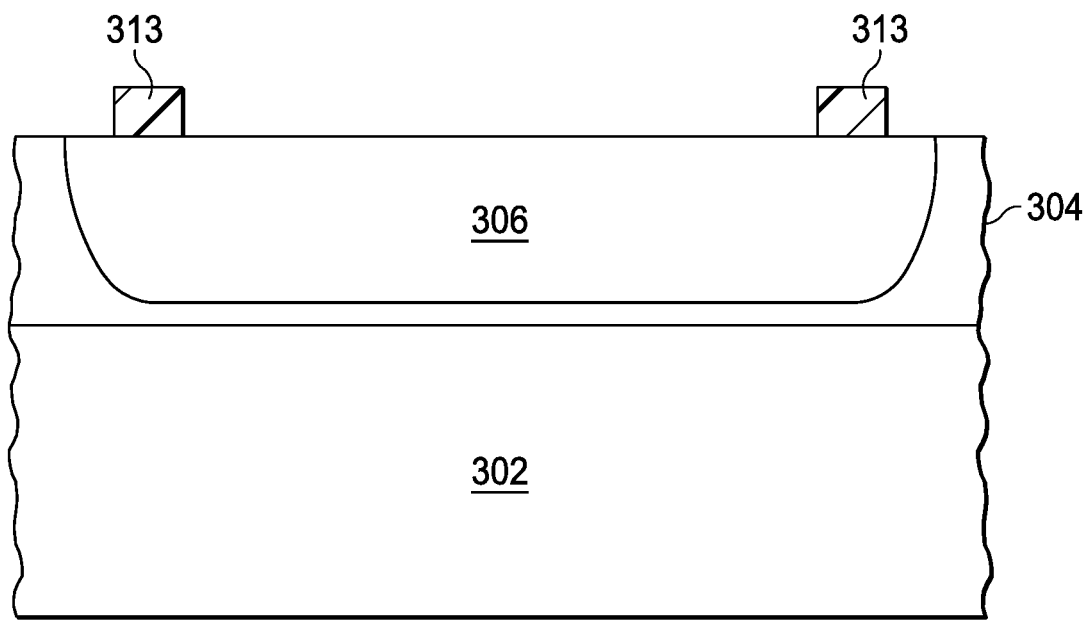
FIGS. 3A-3D (collectively "FIG. 3") are sectional diagrams showing a process for forming an STI structure including a cone defect.
Figure 3B:
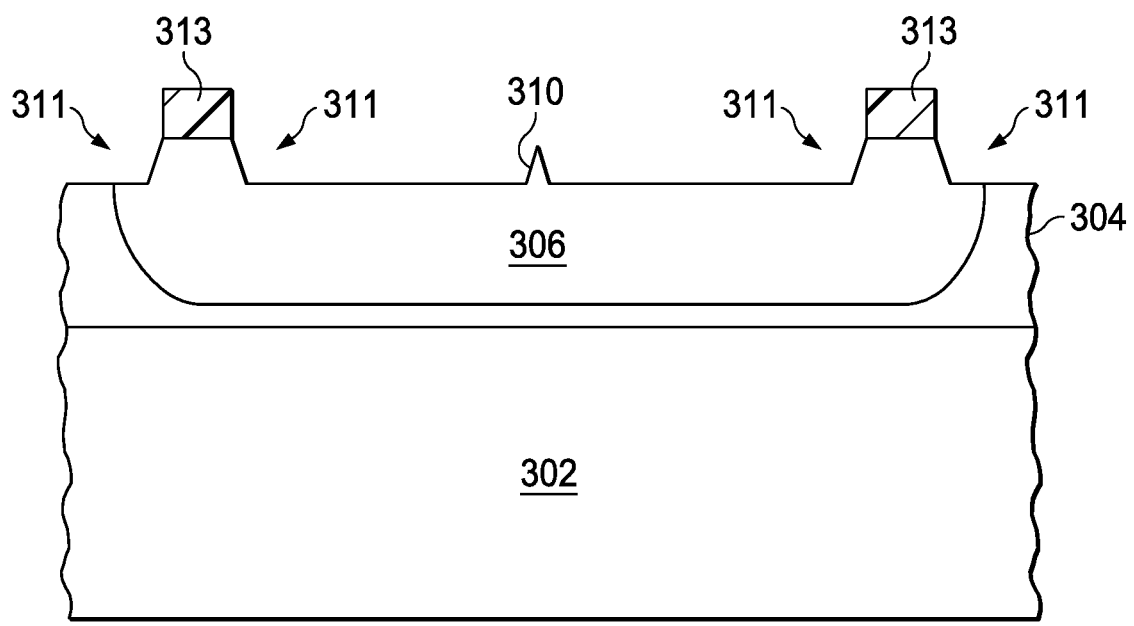

One may use various examples of processes to form an STI layer. FIGS. 3A-3D show a process for forming an STI layer including a cone defect. As shown in FIG. 3A, epitaxial layer 304 is formed on a semiconductor substrate such as substrate 302. In an example, a doped region such as shallow well 306 is formed by patterned ion implantation and has a conductivity type opposite to the conductivity type of epitaxial layer 304. Patterned mask layer 313 is formed in a stacked layer like layers 208-214 of FIG. 2. FIG. 3B shows the structure of FIG. 3A after etching the shallow trench region 311. In an example, shallow trench region 311 is etched using a vertically anisotropic etching process. Because of a stray particle on the surface on shallow well 306, cone 310 is formed during the etching of shallow trench region 311.

Figure 3C:
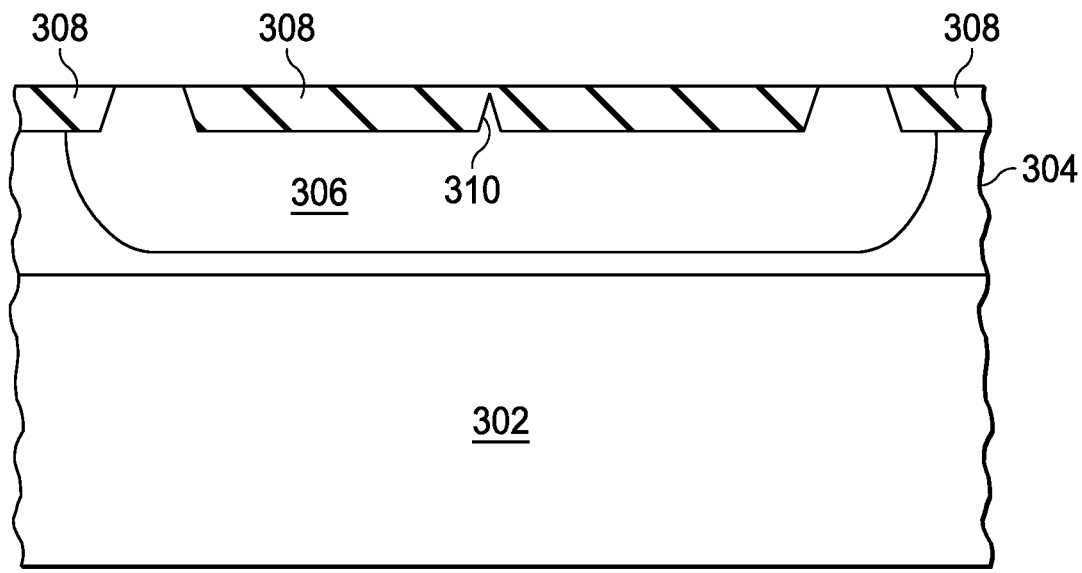
Figure 3D:
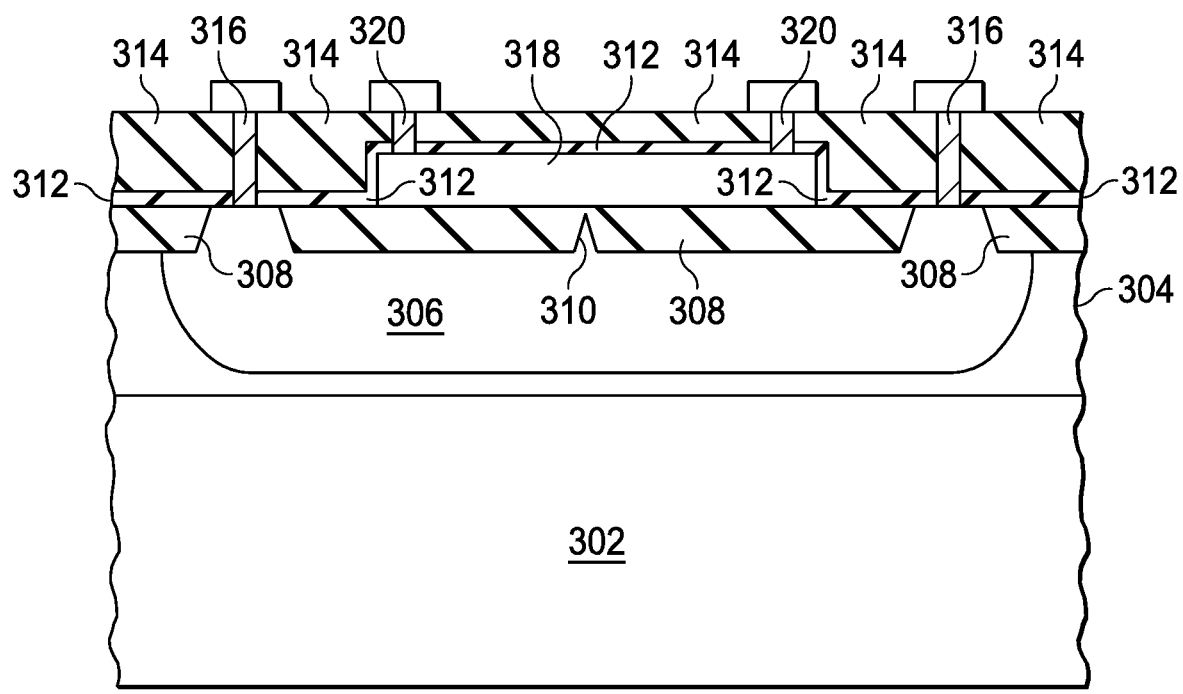

After removing patterned photoresist layer 313, a dielectric layer such as shallow trench isolation layer 308 (STI layer 308) is formed in the shallow trench region 311 (FIG. 3B) using chemical vapor deposition, for example. In an example, the top surface of the structure of FIG. 3C is planarized using chemical-mechanical polishing (CMP). Polycrystalline silicon section 318 is formed by depositing, patterning and doping a polycrystalline silicon layer on an oxide layer, e.g. a pad oxide and a gate oxide, formed on the surface of STI layer 308. FIG. 3D shows a single polycrystalline silicon section 318. However, in many examples, polycrystalline silicon section 318 includes at least two polycrystalline silicon strips. In other examples, polycrystalline silicon section 318 includes ten or more strips formed in parallel. The strips connect in a serpentine (serial) manner or a ladder (parallel) manner or a combination thereof to provide the desired resistance. Insulating layer 312 and insulating layer 314 are deposited using chemical vapor deposition processes onto polycrystalline silicon section 318 and the exposed portions of STI layer 308 and shallow well 306. Shallow well contacts 316 connect to shallow well 306.

Contacts 320 connect to polycrystalline silicon section 318. In an example, deep trench isolation (not shown) surrounds the circuit of FIG. 3D.

Figure 4:
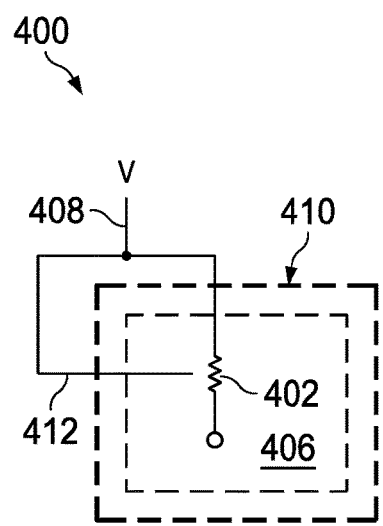
FIG. 4 is a circuit diagram of a resistor and an associated shallow well, according to the example of FIG. 3.

FIG. 4 shows an example circuit configuration using the example of FIG. 3. Resistor 402 corresponds to polycrystalline silicon section 318 (FIG. 3D). Shallow well 406 corresponds to shallow well 306 (FIG. 3D). Deep trench isolation 410 surrounds shallow well 406. One terminal of resistor 402 (e.g. one of contacts 320) couples to a supply voltage such as V 408. The other terminal couples to another portion of the circuit. An example is where resistor 402 provides a pull-up resistor. Shallow well contact 412 corresponds to one or both of contacts 316 (FIG. 3D). In a nonlimiting example V may be 10 V or less. In that case, the lowest localized potential on resistor 402 is ground or 0 V. Therefore, the largest potential across STI layer 308 (FIG. 3) is 10 V and the operation of the circuit of FIG. 4 is expected to have a vanishingly small risk of breaching STI layer 308 (FIG. 3D), even if STI layer 308 (FIG. 3D) includes a cone defect. However, the possibility of cone defects may limit circuit 400 to a V of 10 V to achieve an acceptable failure rate.

Figure 5A:
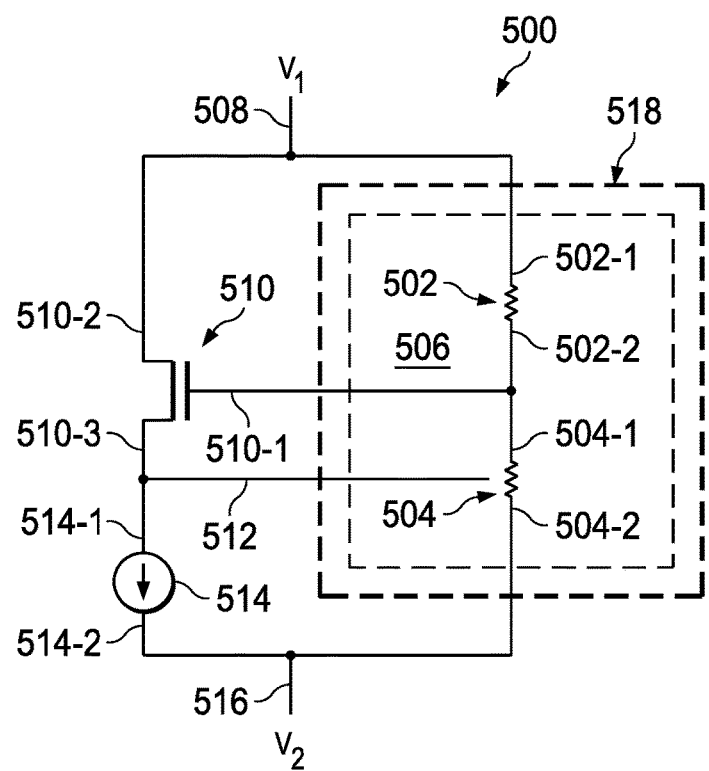
FIGS. 5A and 5B (collectively "FIG. 5") are circuit diagrams of example circuit configurations that may reduce voltage stress on a dielectric between a cone defect and an overlying polysilicon resistor.

FIG. 5A is an example circuit configuration. Rather than one resistor as in FIG. 4, circuit 500 includes resistor portion 502 and resistor portion 504. In this example, resistor portion 502 and resistor portion 504 have the same resistance value. In the example of FIG. 5A terminal 502-1 of resistor portion 502 couples to a circuit node of an integrated circuit at a first voltage $V_1$ 508 and terminal 504-2 of resistor portion 504 couples to a circuit node of the integrated circuit at a second voltage $V_2 < V_1$ 516. Terminals 502-2 and 504-1, respectively, of resistor portions 502 and 504 couple together. Thus, circuit 500 functions as a voltage divider. In this example, transistor 510 is a field effect transistor. Those skilled in the pertinent art will appreciate a bipolar transistor, e.g. an NPN transistor, may replace the transistor 510 with appropriate modification of the circuit 500. A control terminal (gate) 510-1 of transistor 510 couples to the terminals 502-2 and 504-1 of resistor portions 502 and 504 that couple together. One current-handling terminal 510-2 (drain) of transistor 510 couples to $V_1$ 508. The other current-handling terminal 510-3 (source) of transistor 510 couples to shallow well 506 and a terminal 514-1 of current source 514. In this example, deep trench isolation 518 surrounds shallow well 506. The other terminal 510-2 of current source 514 couples to $V_2$ 516. Examples of current source 514 are a fixed current source, a resistor, a breakdown diode or a leakage path.

In one example of circuit 500, $V_1$ is 20 V, $V_2$ is zero volts (ground), and resistor portions 502 and 504 have equal resistance, so the voltage on the gate of transistor 510 is 10 V. Thus, transistor 510 will begin to conduct if the voltage on shallow well terminal 512 falls below 10 V minus the threshold voltage of transistor 510. Thus, the voltage on shallow well 506 is set at 10 V minus one threshold voltage. More generally, the shallow well 506 potential is set to a value with the objective of ensuring the potential difference between the resistor portions 502/504 and the shallow well 506 does not exceed the predetermined reliability limit voltage, e.g. 10 V. The threshold voltage of transistor 510 is determined by the fabrication process used to fabricate transistor 510. In an example, the threshold voltage is a small fraction of a volt. Therefore, the voltage on shallow well 506 is about 10 V. $V_1$ is 20 V, so the localized potential on resistor portion 502 can vary from 10 V to 20 V. Because shallow well 506 is 10 V, the maximum voltage differential between resistor portion 502 and shallow well 506 is thus 20 V minus 10 V or 10 V. Thus, the stress on the STI layer between the shallow well 506 and the resistor portions 502/504 is limited to 10 V. Similarly, the voltage of the terminal of resistor portion 504 that couples to resistor portion 502 is 10 V. The other terminal of resistor portion 504 couples to ground or 0 V. The maximum voltage differential between resistor portion 504 and shallow well 506 is thus 10 V minus 0 V or 10 V. Thus, the stress on the underlying STI layer is limited to 10 V. Current source 514 provides bias to transistor 510 keep transistor 510 in its operational range. Current source 514 thus provides negligible current.

In another example of FIG. 5A, resistor portion 502 and one current-handling terminal of transistor 510 couple to a positive voltage rail Vdd. However, circuit 500 is useful in other configurations. For example, rather than coupling resistor portion 502 and one current-handling terminal of transistor 510 couple to Vdd, resistor portion 502 could couple to a pull-down node in a circuit. Because transistor 510 ties the shallow well to a voltage set by the values of resistor portions 502 and 504, this example also minimizes the stress on the underlying shallow trench isolation layer 608, e.g. STI layer 608 in FIG. 6 described below. In this example, the voltage on resistor portion 502 may vary so that the bias voltage on shallow well 506 may vary and dynamically adjust to the voltage between resistor portion 502 and resistor portion 504. In this case, the relative resistance values of resistor portion 502 and resistor portion 504 may be selected to adjust the range of the bias voltage on shallow well 506. In an additional example, resistor portion 504 may couple to a pull-up node rather than ground. The example circuit 500 of FIG. 5A provides for simplicity of explanation. However, modifications of the example of FIG. 5A can be used as a substitute for a resistor in many cases.

The example circuit 500 may be employed in various circuit implementations in place of a baseline resistor exemplified by the circuit 400. In general a first terminal of the circuit 500, e.g. the terminal 502-1, is connected to a first circuit node of an integrated circuit, and a second terminal of the circuit 500, e.g. the terminal 504-2, is connected to a second circuit node of the integrated circuit. The drain terminal 510-2 of the transistor FET 510 may optionally connect to the terminal 502-1 or to $V_1$ 508. The terminal 514-2 may optionally connect to a ground reference, as shown, or to a negative supply rail, e.g. –Vdd, depending on the polarity of the signal connected to the resistor terminal 502-1.

Figure 5B:
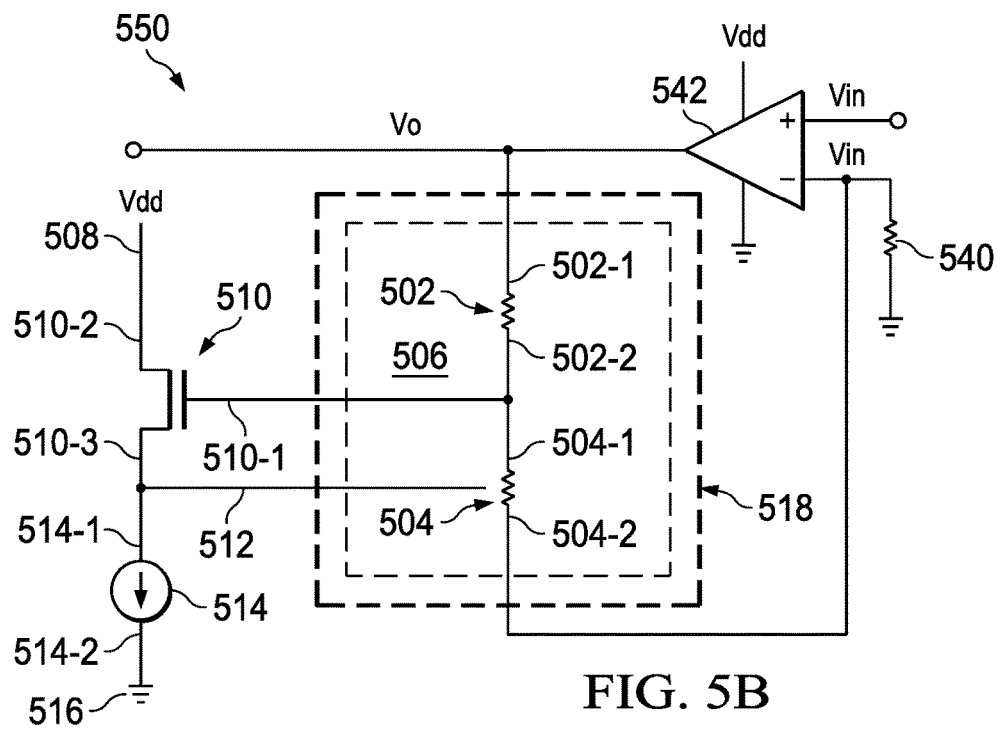

FIG. 5B is an example circuit 550 configuration that illustrates use of the circuit 500 in a functional circuit 550 in a nonlimiting example. Like-numbered elements from circuit 500 of FIG. 5A perform similar functions in circuit 550 of FIG. 5B. Circuit 550 is a closed-loop operational amplifier circuit with resistor portion 502 and resistor portion 504 coupled in a negative feedback loop of operational amplifier (op amp) 542. In the example of FIG. 5B the terminal 502-1 of resistor portion 502 couples to the output of op amp 542 and terminal 504-2 of resistor portion 504 couples to the inverting input of op amp 542. The terminals 502-2 and 504-1 of respective resistor portions 502 and 504 couple together. Another resistor 540 is connected between the inverting input of op amp 542 and ground. In this configuration, the ratio between the combined resistor of resistor 502 and resistor 504 to the resistance of resistor 540 determines the gain of circuit 550. Because the gate 510-1 of transistor 510 is at the voltage between resistor 502 and resistor 504, e.g. ½ (Vo-Vin), the voltage on the current-handling terminal coupled to shallow well 506 is the voltage between resistor 502 and resistor 504 minus the threshold voltage of transistor 510. Therefore, the voltage on shallow well 506 is set to approximately ½ (Vo-Vin). This voltage will dynamically adjust to variations of Vo-Vin. Thus, the voltage on shallow well 506 adjusts to maintain a voltage that reduces stress between shallow well 506 and resistors 502 and 504.

In another example, op amp 542 has a dual-rail configuration. In this case, the terminal 514-2 of the current source 514 is connected to a negative-voltage rail, e.g. –Vdd, while the drain terminal 510-2 of transistor 510 may be connected to Vdd 508, as shown, or to the resistor terminal 502-1. More generally, the terminal 514-2 is connected to a voltage source that ensures the potential of the terminal 514-2 is lower than the potential at the terminal 514-1. These design choices may be relevant to the voltage specification of the transistor 510, wherein a larger voltage drop from the drain terminal 510-2 to the source terminal 510-3 may require a transistor 510 capable of handling higher voltage.

Figure 6:
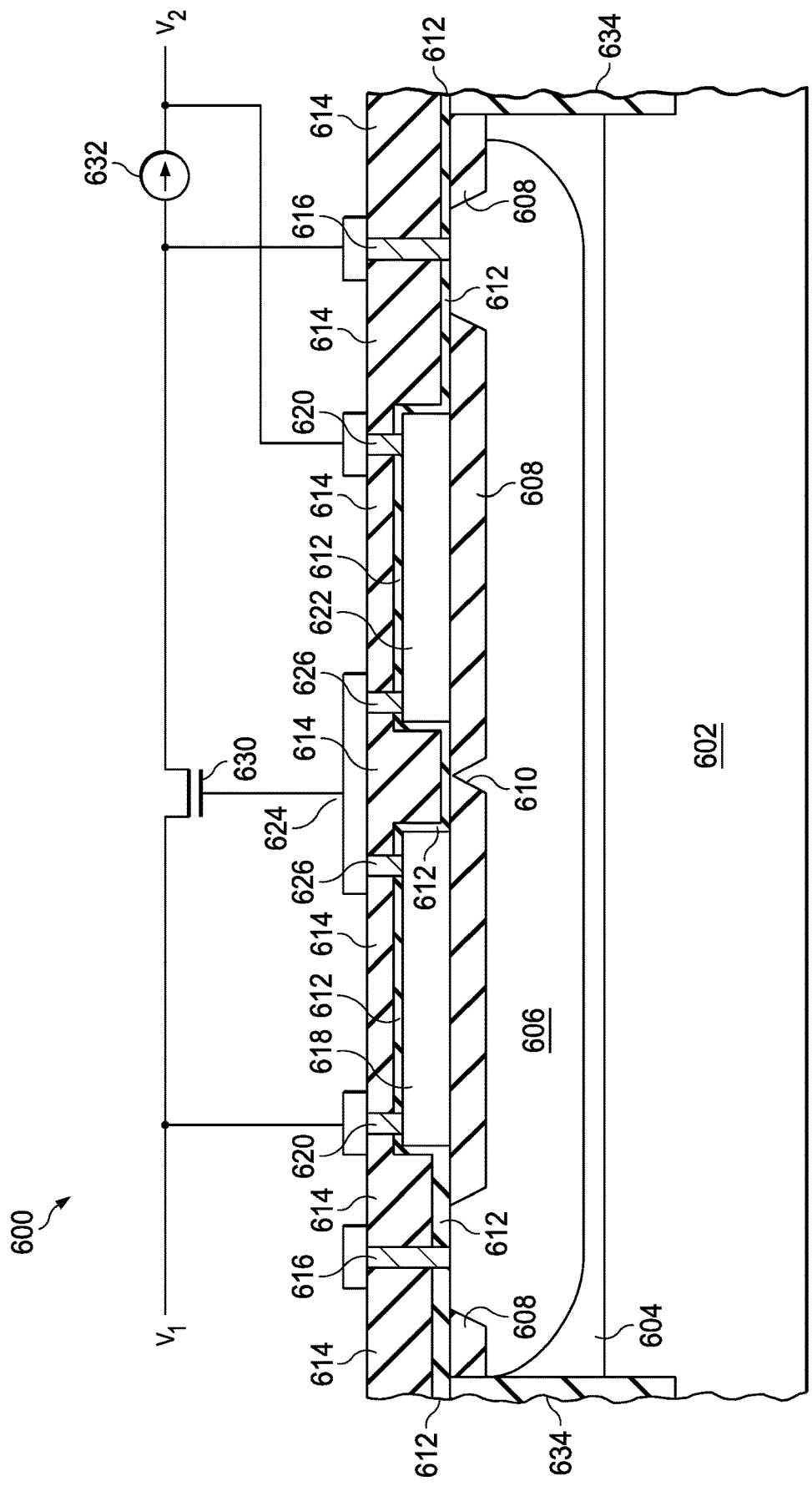
FIG. 6 is a sectional diagram of a device in an example circuit including a cone defect.

FIG. 6 is an example circuit 600. Substrate 602, epitaxial layer 604, shallow well 606, shallow trench isolation layer (STI layer) 608, cone 610, insulating layer 612, insulating layer 614 and shallow well contacts 616 are like substrate 302, epitaxial layer 304, shallow well 306, shallow trench isolation layer (STI layer) 308, cone 310, insulating layer 312, insulating layer 314 and shallow well contacts 316 of FIG. 3. Deep trench isolation 634 surrounds shallow well 606. Circuit 600 may be a stand-alone device or may be one device in an integrated circuit including at least two devices. Rather than a single polycrystalline silicon section 318 (such as in FIG. 3, for example), circuit 600 includes first polycrystalline silicon section 618 and second polycrystalline silicon section 622, which correspond to resistor portion 502 and resistor portion 504 (FIG. 5), respectively. As with FIG. 3, FIG. 6 shows a single polycrystalline silicon section 618 and a single polycrystalline silicon section 622 located over the STI layer 608. (An insulating layer such as silicon dioxide, not shown, may be located between the polysilicon sections 618, 622 and the STI layer 608.) However, in many examples, polycrystalline silicon section 618 and polycrystalline silicon section 622 include at least two polycrystalline silicon strips. In other examples, polycrystalline silicon section 618 and polycrystalline silicon section 622 include ten or more strips formed in parallel. The strips connect in a serpentine (serial) manner or a ladder (parallel) manner or a combination thereof to provide the desired resistance.

Transistor 630 is like transistor 510 of FIG. 5 and current source 632 is like current source 514 of FIG. 5. As with current source 514 (FIG. 5), examples of current source 632 are a fixed current source a resistor, a breakdown diode or a leakage path. Contacts 626 are coupled by lead 624, which couples to the gate of transistor 630. One current-handling terminal (source/drain) of transistor 630 couples to an integrated circuit node at a potential $V_1$, and one of contacts 620. The other contact 620 couples to an integrated circuit node at a potential $V_2<V_1$. The other current-handling terminal (source/drain) of transistor 630 couples to one terminal of current source 632. The other terminal of current source 632 couples to ground. Circuit 600 operates in the manner described hereinabove for circuit 500 (FIG. 5).

Figures 7, 9:
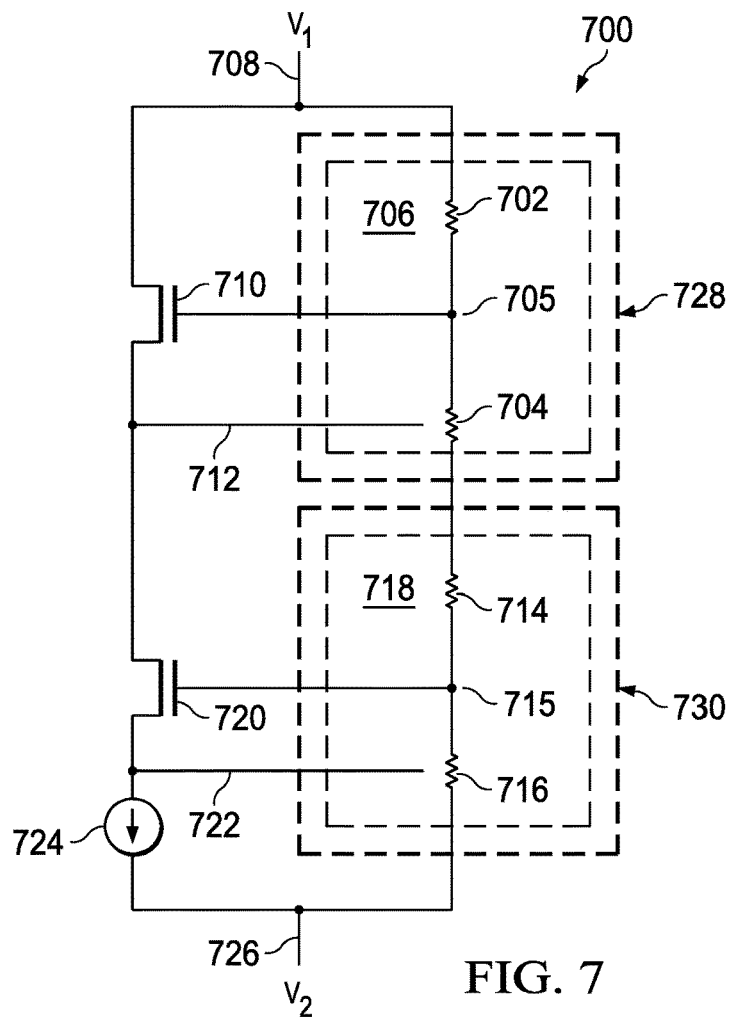
FIG. 7 is a circuit diagram showing another example circuit.
FIG. 9 a process diagram showing an example process, e.g. for implementing the circuit of FIG. 5.

FIG. 7 shows another example circuit 700. Circuit 700 is a series of two circuits like circuit 500 (FIG. 5) to provide for operation at higher voltages. While circuit 700 includes two circuits like circuit 500 (FIG. 5), any number of circuits may connect in series to allow for operation using even higher voltages. In this example, $V_1$ is 40 V and $V_2$ is ground. Resistor portion 702 and resistor portion 704 are proximate to shallow well 706. Deep trench isolation 728 surrounds shallow well 706. Resistor portion 714 and resistor portion 716 are proximate to shallow well 718. Deep trench isolation 730 surrounds shallow well 718. In other examples, a deep trench isolation surrounds both shallow well 706 and shallow well 718. Resistor portions 702, 704, 714 and 716 are connected in series between $V_1$ 708 and $V_2$ 726. Therefore, these resistor portions function as a voltage divider. In this example, resistor portions 702, 704, 714 and 716 have equal resistance value. Therefore, the voltage at the node 705 between resistor portion 702 and 704 is 30 V and the voltage at the node 715 between resistor portions 714 and 716 is 10 V. The control terminal (gate) of transistor 710 couples to node 705. One current-handling terminal (source/drain) of transistor 710 couples to $V_1$ 708. Therefore, transistor 710 turns on when the voltage at the other current-handling terminal (source/drain) of transistor 710 goes below 30 V minus the threshold voltage of transistor 710. Thus, shallow well 706 is set at 30 V via lead 712.

The control terminal (gate) of transistor 720 couples to node 715, which is at 10 V. One current-handling terminal (source/drain) of transistor 720 couples to the current-handling terminal of transistor 710 that is set at 30 V. Therefore, transistor 720 turns on when the voltage at the other current-handling terminal (source/drain) of transistor 720 goes below 10 V minus the threshold voltage of transistor 720. Thus, shallow well 718 is set at 10 V via lead 722. The lowest voltage of resistor portion 704 is at 20 V. The highest voltage of resistor portion 702 is 40 V. Because shallow well 706 is set at 30 V, no portion of the STI between shallow well 706 and resistor portions 702 and 704 is greater than 10 V. The lowest voltage of resistor portion 716 is at 0 V. The highest voltage of resistor portion 714 is 20 V. Because shallow well 718 is set at 10 V, no portion of the STI between shallow well 718 and resistor portions 714 and 716 is greater than 10 V. Thus, circuit 700 handles 40 V, but the stress on the STI between shallow well 706 and resistor portions 702 and 704, and the stress on the STI between shallow well 718 and resistor portions 714 and 716 is not more than 10 V. As with current source 514 (FIG. 5), current source 724 provides a negligible current to keep transistors 710 and 720 biased in their operating range. Examples of current source 724 are a fixed current source a resistor, a breakdown diode or a leakage path.

As noted hereinabove, any number of resistor portion pairs can be cascaded to provide higher voltage operation with a transistor control terminal coupled to the node between the resistor portion pairs and shallow well proximate to the resistor portion pairs coupled to one current-handling terminal of the transistor. In this way, the shallow well ties to a voltage that is intermediate to the voltages of the resistor portion pair, which mitigates the voltage stress on the STI. As with the example of FIG. 5, different coupling of resistor portions 702 and 716 provides for using circuit 700 in most configurations where a resistor is employed.

Figure 8:
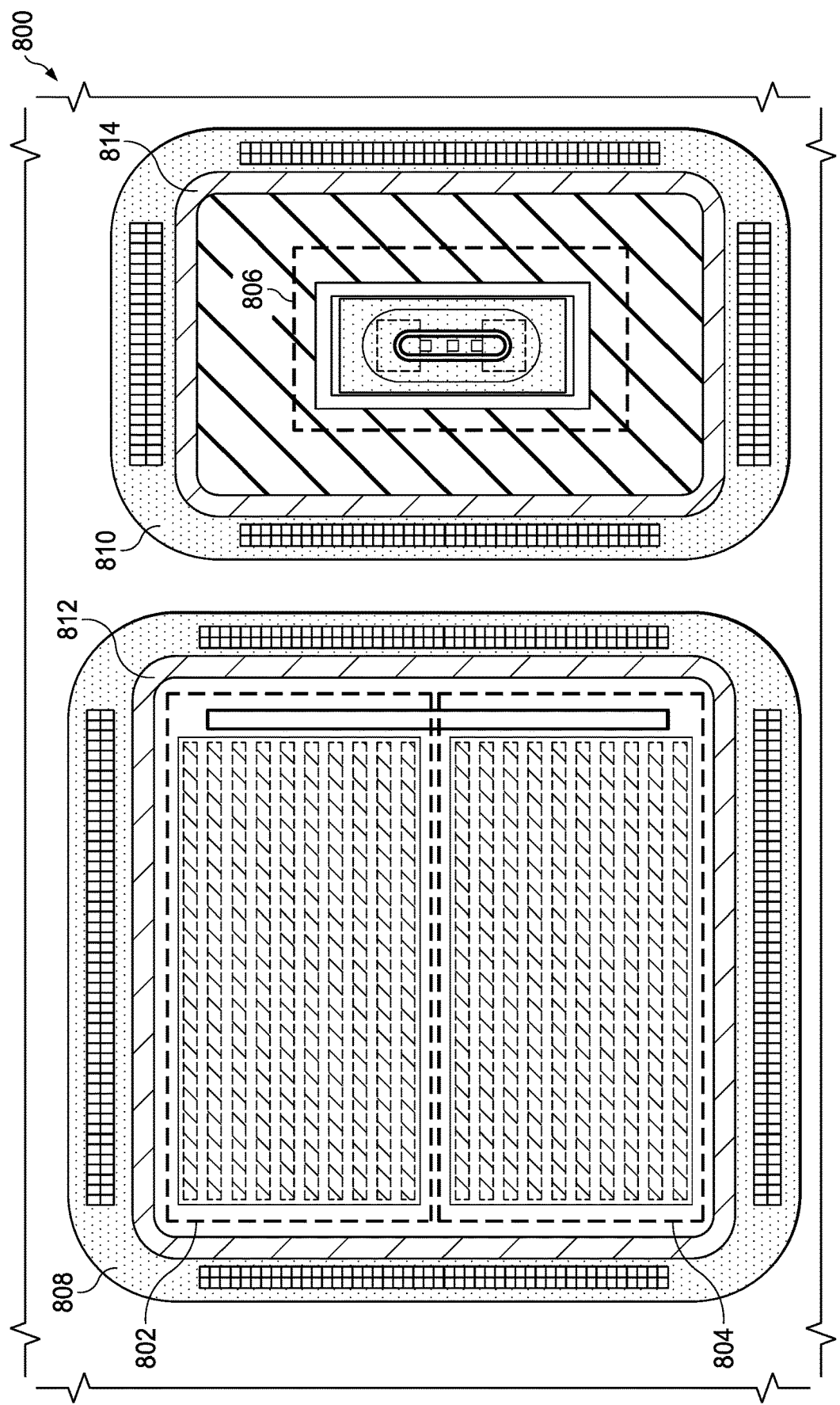
FIG. 8 is a layout diagram showing an example device layout.

FIG. 8 shows an example layout 800 which may be employed in various examples. For example, resistors 802 and 804 may correspond to resistors 502 and 504 (FIG. 5). Also, transistor 806 may correspond to transistor 510 (FIG. 5). Deep trench 812 and deep well 808 isolate resistor portions 802 and 804 from other circuits on the device die. Deep trench isolation ring 814 and deep well 810 isolate transistor 806. As shown in FIG. 8, each of resistor portion 802 and resistor portion 804 includes ten polycrystalline strips. In this example, the ten polycrystalline silicon strips are connected in series in a serpentine fashion to provide the desired resistance. In other example, the polycrystalline strips may be connected in parallel or a combination of parallel and series connections. FIG. 8 omits interconnections between components for clarity. While the layout may serve as an illustrative example, implementations in accordance with the disclosed examples are not limited to any particular layout.

FIG. 9 shows an example process 900 which may be implemented by various circuit examples, e.g. integrating the circuit 500 into an integrated circuit. Step 902 couples a control terminal (gate) of a transistor and first terminals of a first resistor portion and a second resistor portion at a same node. The first resistor portion and the second resistor portion are proximate to a shallow well in a substrate. An insulating layer is located between the shallow well and the first and second resistor portions. Step 904 couples a first current-handling terminal (source/drain) of the transistor to a first voltage node, and couples a second terminal of the first resistor portion to a first integrated circuit node. Optionally the first current-handling terminal of the transistor is also coupled to the first integrated circuit node. Step 906 couples a second current-handling terminal of the transistor (drain/source), the shallow well, and a first terminal of a current source at a same node. In additional steps, a second terminal of the current source may be coupled to a second voltage node, and a second terminal of the second resistor portion is coupled to a second integrated circuit node. The first integrated circuit node may be configured to operate at a voltage $V_1$, and the second integrated circuit node may be configured to operate at voltage $V_2<V_1$. Optionally the second terminal of the current source and the second terminal of the second resistor portion are coupled to a same node. Thus, by the process 900 a circuit such as the circuit 900 may be formed that is configured to hold the shallow well at a voltage that is a fraction less than unity of a voltage difference between the first terminals of the first and second resistor portions.

Modifications are possible in the described examples, and other examples are possible, within the scope of the claims.

What is claimed is:

1. An integrated circuit, comprising:
   a first resistor portion having a first terminal and a second terminal, and a second resistor portion having a third terminal and a fourth terminal, the first and second resistor portions located over a semiconductor substrate;
   a shallow well located between the semiconductor substrate and the first and second resistor portions;
   an insulating layer located between the shallow well and the first and second resistor portions; and
   a transistor having a control terminal, the control terminal and the second and third terminals connected at a first same node, the transistor having a first current-handling terminal connected to a first voltage node and having a second current-handling terminal connected at a second same node to a current source and the shallow well.

2. The integrated circuit of claim 1 in which the first current-handling terminal and the first terminal are connected at a third node.

3. The integrated circuit of claim 1 in which the fourth terminal and the current source are connected at a fourth node.

4. The integrated circuit of claim 1 in which the transistor is a field effect transistor.

5. The integrated circuit of claim 1 in which the insulating layer is a shallow trench isolation layer.

6. The integrated circuit of claim 1 in which the first resistor portion and the second resistor portion include polycrystalline silicon.

7. The integrated circuit of claim 1 in which the first terminal is connected to a first circuit node, and the fourth terminal is connected to a second circuit node.

8. The integrated circuit of claim 1 in which the shallow well is a first shallow well, the insulating layer is a first insulating layer, the transistor is a first transistor and the control terminal is a first control terminal, the integrated circuit further comprising:
- a third resistor portion having a fifth terminal and a sixth terminal, and a fourth resistor portion having a seventh terminal and an eighth terminal connected to the first terminal, the sixth terminal of the third resistor portion and the seventh terminal of the second resistor portion being connected at a fifth same node;
- a second shallow well in the semiconductor substrate proximate to the third resistor portion and the fourth resistor portion;
- a second insulating layer between the second shallow well and the third resistor portion and the fourth resistor portion; and
- a second transistor having a second control terminal connected at a same sixth node to the sixth terminal and the seventh terminal, the second transistor having a third current-handling terminal connected at a same seventh node to the first current-handling terminal and to the second shallow well.

* * * * *